United States Patent
Nakagawa et al.

(10) Patent No.: US 9,396,299 B2
(45) Date of Patent: Jul. 19, 2016

(54) RETICLE MARK ARRANGEMENT METHOD AND NONTRANSITORY COMPUTER READABLE MEDIUM STORING A RETICLE MARK ARRANGEMENT PROGRAM

(71) Applicant: Kabushiki Kaisha Toshiba, Minato-ku (JP)

(72) Inventors: Shinichi Nakagawa, Yokohama (JP); Nobuhiro Komine, Nagoya (JP); Kazuhiro Segawa, Kuwana (JP); Manabu Takakuwa, Tsu (JP); Motohiro Okada, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/476,884

(22) Filed: Sep. 4, 2014

(65) Prior Publication Data

US 2015/0339423 A1    Nov. 26, 2015

(30) Foreign Application Priority Data

May 23, 2014    (JP) ................................ 2014-107442

(51) Int. Cl.
*G06F 17/50*    (2006.01)
*G03F 1/42*    (2012.01)
*G03F 1/70*    (2012.01)

(52) U.S. Cl.
CPC .............. *G06F 17/5068* (2013.01); *G03F 1/42* (2013.01); *G03F 1/70* (2013.01)

(58) Field of Classification Search
CPC .................................................... G06F 17/5068
USPC ............................................................ 716/55
See application file for complete search history.

(56) References Cited

U.S. PATENT DOCUMENTS

| | | | |
|---|---|---|---|
| 7,100,146 B2 | 8/2006 | Sato et al. | |
| 7,692,319 B2 | 4/2010 | Sogawa | |
| 8,043,928 B2 | 10/2011 | Sogawa | |
| 2001/0049289 A1* | 12/2001 | Kim | 455/466 |
| 2004/0259322 A1* | 12/2004 | Lu et al. | 438/426 |
| 2005/0260510 A1* | 11/2005 | Hommen et al. | 430/22 |
| 2008/0044741 A1* | 2/2008 | Sarma et al. | 430/5 |

FOREIGN PATENT DOCUMENTS

| | | |
|---|---|---|
| JP | 5-324768 | 12/1993 |
| JP | 11-338123 | 12/1999 |
| JP | 2004-77550 | 3/2004 |
| JP | 2007-96239 | 4/2007 |

* cited by examiner

*Primary Examiner* — Vuthe Siek

(74) *Attorney, Agent, or Firm* — Oblon, McClelland, Maier & Neustadt, L.L.P.

(57) ABSTRACT

Reticle marks are arranged at a plurality of places in a kerf region of a reticle, the area of a polygon with apexes at arrangement positions of the reticle marks is calculated, and the arrangement positions of the reticle marks are decided based on results of calculation of the area of the polygon.

18 Claims, 8 Drawing Sheets

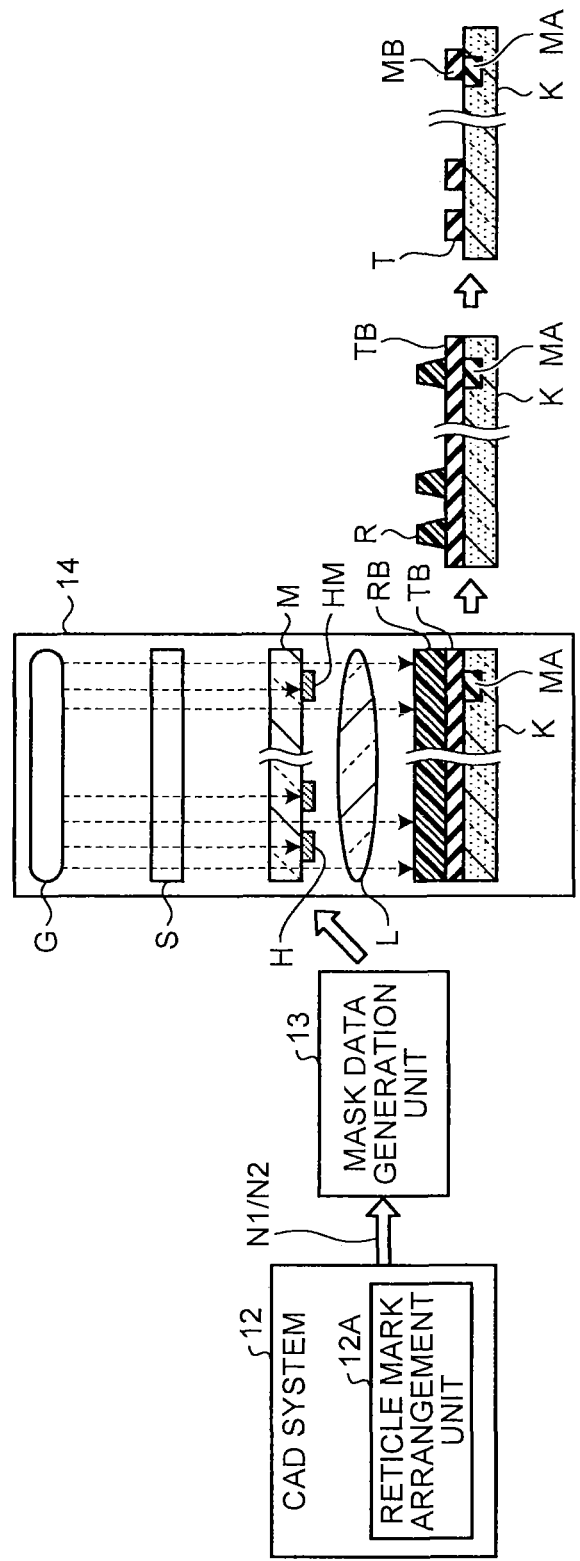

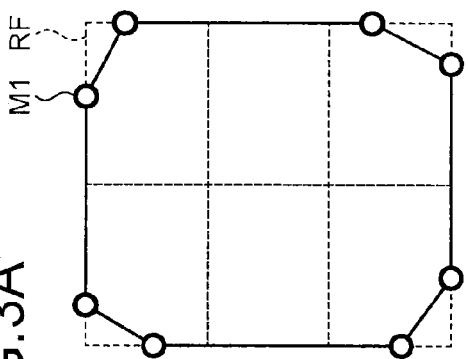
FIG.3A
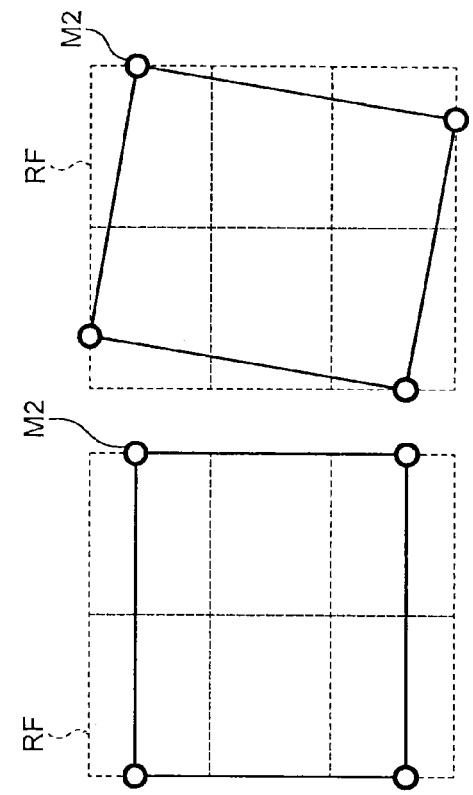
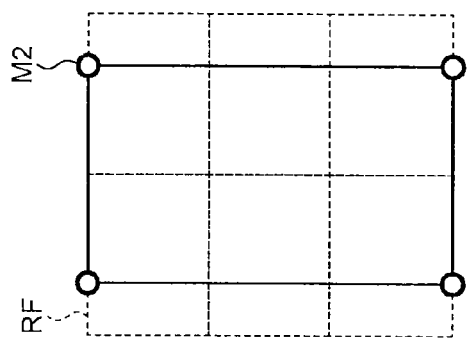
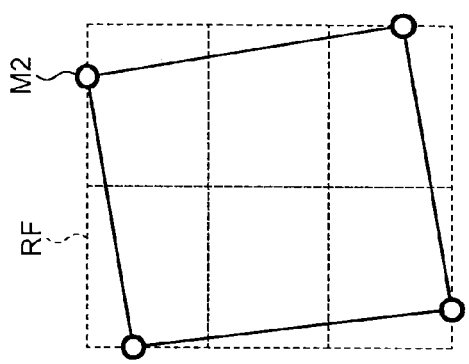
FIG.3B

FIG.4A
| MARK | M1 | M2 | M3 | M4 | M5 |
|---|---|---|---|---|---|
| | ○ | ◯ | ⊙ | ⊙ | ⊙ |
| WEIGHT | W1 | W2 | W3 | W4 | W5 |
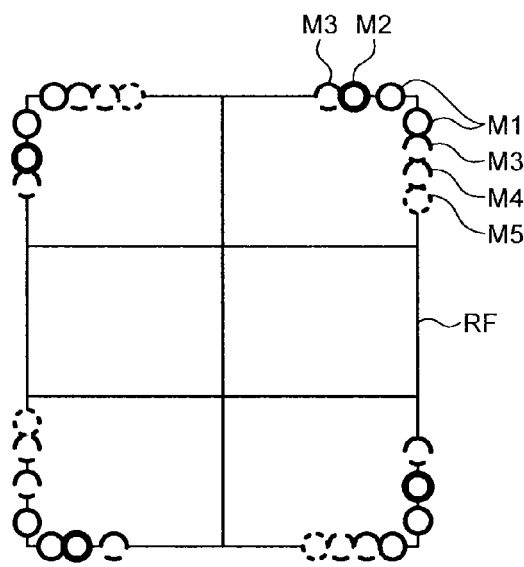
FIG.4B
FIG.4C
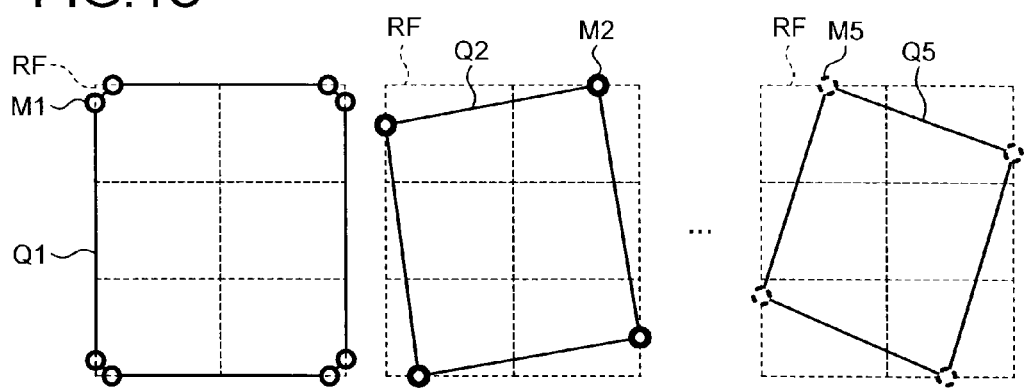
FIG.4D
QS=Q1+Q2+···+Q5

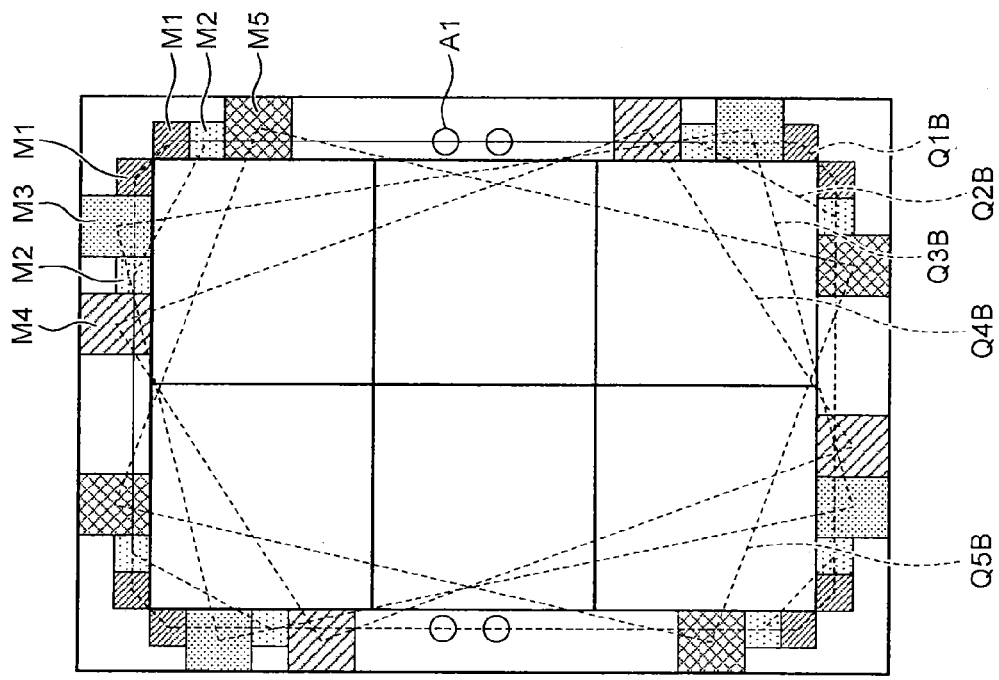
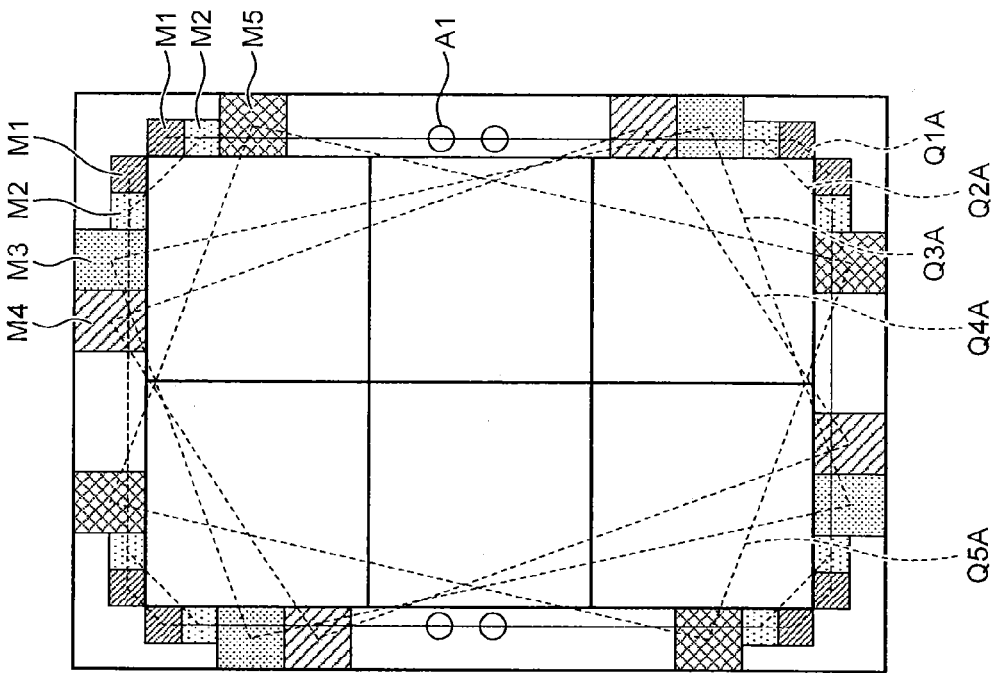

RETICLE MARK ARRANGEMENT METHOD AND NONTRANSITORY COMPUTER READABLE MEDIUM STORING A RETICLE MARK ARRANGEMENT PROGRAM

CROSS-REFERENCE TO RELATED APPLICATIONS

This application is based upon and claims the benefit of priority from Japanese Patent Application No. 2014-107442, filed on May 25, 2014; the entire contents of which are incorporated herein by reference.

FIELD

Embodiments described herein relate generally to a reticle mark arrangement method and a nontransitory computer readable medium storing a reticle mark arrangement program.

BACKGROUND

In a process for manufacturing a semiconductor device, a misalignment of upper and lower layers may cause device performance degradation and wiring short-circuit. Accordingly, the misalignment of the upper and lower layers is measured, a value for correcting the misalignment is determined from measurement results, and the correction value is returned to an APC (Advanced Process Control).

BRIEF DESCRIPTION OF THE DRAWINGS

FIG. 1A is a block diagram of a system configuration to which a reticle mark arrangement method according to a first embodiment is applied, FIG. 1B is a schematic cross-sectional diagram of an exposure device where a reticle generated in the system illustrated in FIG. 1A is used, FIG. 1C is a cross-sectional diagram illustrating a process after formation of a resist pattern, and FIG. 1D is a cross-sectional diagram illustrating a process after formation of a processed pattern;

FIGS. 3A and 3B are diagrams illustrating patterns of reticle mark arrangement according to the first embodiment;

FIGS. 4A to 4D are diagrams illustrating a method for reticle mark arrangement with a plurality of patterns of reticle mark arrangement according to the first embodiment;

FIGS. 5A and 5B are diagrams illustrating a comparative example of an area of reticle mark arrangement positions with a plurality of patterns of reticle mark arrangement according to the first embodiment;

DETAILED DESCRIPTION

Figure 2B:
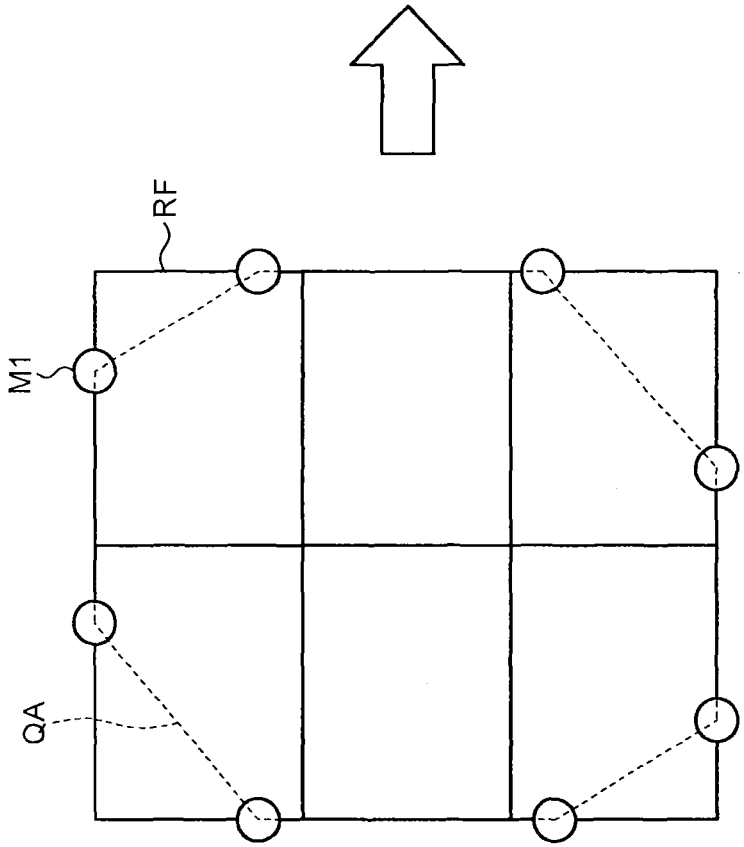
FIGS. 2A and 2B are diagrams illustrating a method for reticle mark arrangement with one pattern of reticle mark arrangement according to the first embodiment.

According to one embodiment, reticle marks are arranged at a plurality of places in a kerf region of a reticle, the area of a polygon with apexes at arrangement positions of the reticle marks is calculated, and the arrangement positions of the reticle marks are decided based on results of calculation of the area of the polygon.

Exemplary embodiments of a reticle mark arrangement method will be explained below in detail with reference to the accompanying drawings. The present invention is not limited to the following embodiments.

(First Embodiment)

FIG. 1A is a block diagram of a schematic system configuration to which a reticle mark arrangement method according to a first embodiment is applied, FIG. 1B is a schematic cross-sectional diagram of an exposure device in which a reticle generated in the mask system illustrated in FIG. 1A is used, FIG. 1C is a cross-sectional diagram illustrating a process after formation of a resist pattern, and FIG. 1D is a cross-sectional diagram illustrating a process after formation of a processed pattern. In the foregoing description, reticle marks are provided on a reticle, and misalignment measurement marks are provided on a semiconductor wafer.

Referring to FIG. 1A, the mask system is provided with a CAD system 12 and a mask data generation unit 13. The CAD system 12 is provided with a reticle mark arrangement unit 12A. Referring to FIG. 1B, an exposure device 14 is provided with a light source G, a diaphragm S, a reticle M, and a lens L.

The reticle mark arrangement unit 12A arranges reticle marks HM at a plurality of places in a kerf region of the reticle M. The reticle mark arrangement unit 12A can also calculate the area of a polygon with apexes at the arrangement positions of the reticle marks HM, and decide the arrangement positions of the reticle marks HM based on calculation results of the area of the polygon. A kerf region can be used to provide a scribe region on a semiconductor wafer. In addition, the reticle marks HM can be used to form misalignment measurement marks MB for measuring misalignment of upper and lower layers in the scribe region of the semiconductor wafer. The reticle marks HM corresponding to the misalignment measurement marks MB which are compared with each other at measurement of misalignment of the upper and lower layers can be arranged so as to overlap each other between the reticles M. The reticle marks HM corresponding to the misalignment measurement marks which are not compared with each other at measurement of misalignment of the upper and lower layers can be arranged so as not to overlap each other between the reticles M. The misalignment measurement marks MA and MB can be used to measure separate misalignments in each of an active region, a gate electrode, a wiring layer, and a contact hall. At that time, the reticle marks HM may include N (N is an integer of 2 or more) kinds of reticle marks.

In this case, the reticle mark arrangement unit 12A can calculate the sum of the areas of the N polygons with apexes at the arrangement positions of the N kinds of reticle marks HM, and decide the arrangement positions of the N kinds of reticle marks HM based on calculation results of the sum of the areas of the polygons. At that time, the reticle mark arrangement unit 12A can decide the arrangement positions of the N kinds of reticle marks HM such that the sum of the areas of the N polygons become the largest under a certain constrain condition. Under the constrain condition, for example, the reticle marks HM corresponding to the misalignment measurement marks which are not compared with each other at measurement of misalignment are arranged as close as possible to the four corners of the reticle M such that the reticle marks HM do not overlap each other between the reticles M.

Then, at the CAD system 12, design layout data N1 for a semiconductor integrated circuit is generated and sent to the mask data generation unit 13. At the reticle mark arrangement unit 12A, mark data N2 in which the reticle marks HM are arranged at a plurality of places in the kerf region of the reticle M is generated and sent together with the design layout data N1 to the mask data generation unit 13.

Then, at the mask data generation unit 13, mask data corresponding to a design layout pattern specified by the design layout data N1 and a mark pattern specified by the mark data N2 is generated. In addition, a circuit pattern H and the reticle marks HM corresponding to the mask data generated at the mask data generation unit 13 are formed by a light-shield film on the reticle M.

Meanwhile, as illustrated in FIG. 1B, a processed film TB is formed on a foundation layer K, and a resist film RB is applied to the processed film TB. The foundation layer K and the processed film TB may be semiconductor substrates, or insulating films such as silicon dioxide films or silicon nitride films, or semiconductor films of amorphous silicon or polycrystalline silicon, or metal films of Al, Cu, or the like.

Then, exposure light such as ultraviolet rays is emitted from the light source G and is narrowed by the diaphragm S, and then enters the resist film RB via the reticle M and the lens L, thereby the resist film RB is exposure to light.

Next, as illustrated in FIG. 1C, after the exposure of the resist film RB, the resist film RB is developed to form a resist pattern R corresponding to the circuit pattern H and the reticle marks HM on the reticle M.

Next, as illustrated in FIG. 1D, the processed film TB is processed using as a mask the resist pattern R to which the circuit pattern H and the reticle marks HM are transferred, thereby to form misalignment measurement marks MB in accordance with the processed pattern T and the reticle marks HM corresponding to the circuit pattern H of the reticle M. The processed film TB may be processed by etching or ion implantation.

At that time, a misalignment of upper and lower layers is measured with the assumption that the foundation layer K is the lower layer and the processed film TB is the upper layer. After formation of the misalignment measurement marks MA on the foundation layer K in the previous process, the misalignment measurement marks MB are formed on the processed film TB in this process. Then, the misalignment measurement marks MA and MB are observed under a microscope and the positions of the misalignment measurement marks MA and MB are compared to measure the misalignment of the upper and lower layers. If the misalignment of the upper and lower layers exceeds a prescribed value, a correction value may be determined from measurement results and sent to an APC (Advanced Process Control). Correction values for points other than the measurement points can be determined by interpolation or extrapolation.

By deciding the arrangement positions of the reticle marks HM based on calculation results of the area of a polygon with apexes at the arrangement positions of the reticle marks HM, it is possible to arrange the reticle marks HM closer to the four corners of the reticle M. This makes it possible to increase position shifts of the reticle marks HM resulting from a skew in the reticle M or the like. Accordingly, it is possible to increase position shifts of the misalignment measurement marks MB and thus improve the accuracy of measurement misalignment of the upper and lower layers.

Figure 2A:
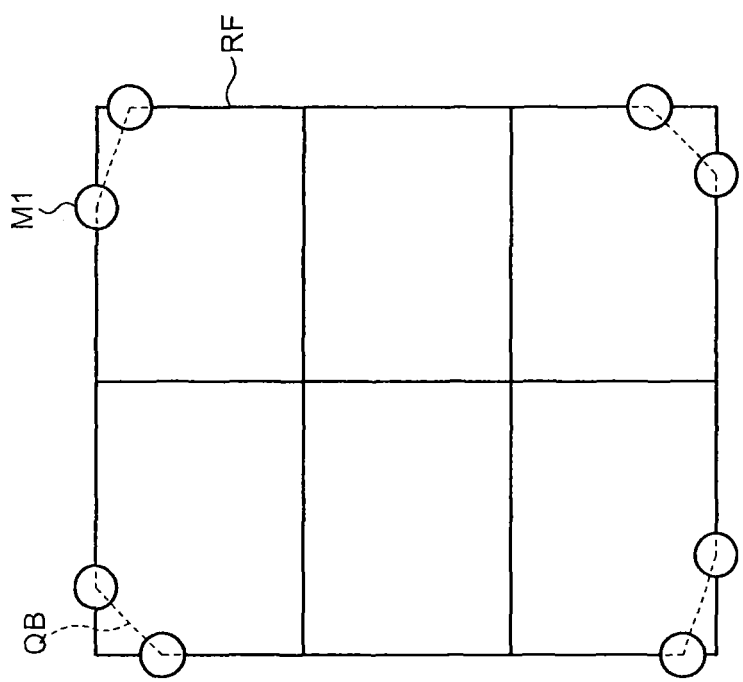

FIGS. 2A and 2B are diagrams illustrating a method for reticle mark arrangement with one pattern of reticle mark arrangement according to the first embodiment.

Referring to FIG. 2A, reticle marks M1 are arranged in a kerf region RF of a reticle. At that time, an area QA of a polygon with apexes at the arrangement positions of the reticle marks M1 is determined. Further, as illustrated in FIG. 2B, the arrangement positions of the reticle marks M1 are changed, and an area QB of a polygon with apexes at the arrangement positions is determined. Then, the areas QA and QB are compared, and the arrangement positions in the larger area can be selected. At that time, the arrangement positions of the reticle marks M1 are preferably decided such that the area of a polygon with apexes at the arrangement positions of the reticle marks M1 becomes the largest.

FIGS. 3A and 3B are diagrams illustrating patterns of reticle mark arrangement according to the first embodiment.

Referring to FIGS. 3A and 3B, the numbers of reticle marks M1 and M2 to be arranged are set according to specifications required for alignment. For example, if the specifications required for alignment are stricter for a layer to be exposed to light via a reticle on which the reticle marks M1 are arranged than for a layer to be exposed to light via a reticle on which the reticle marks M2 are arranged, the number of the reticle marks M1 to be arranged may be larger than the number of the reticle marks M2 to be arranged. In the example of FIG. 3A, the number of the reticle marks M1 to be arranged is set to 8, and in the example of FIG. 3B, the number of the reticle marks M2 to be arranged is set to 4. For example, the specifications required for alignment are stricter in the case where the reticle is for use in liquid immersion light exposure.

At that time, if it is assumed that the reticle marks M1 and M2 are arranged closer to the four corners of the reticle, when the number of the reticle marks M1 to be arranged is 8, the number of patterns of arrangement is one as illustrated in FIG. 3A, whereas, when the number of the reticle marks M2 to be arranged is 4, the number of patterns of arrangement is four as illustrated in FIG. 3B. If there exist N (N is an integer of 2 or more) kinds of the reticle marks M2, the number of patterns of arrangement is $4^N$. In addition, in the case where the N kinds of the reticle marks M2 are arranged in the kerf region RF, the sums of areas of polygons are calculated in the $4^N$ patterns, and the arrangement positions of the reticle marks M2 can be decided such that the sum of areas of polygons at that time becomes the largest.

FIGS. 4A to 4D are diagrams illustrating a method for reticle mark arrangement with a plurality of patterns of reticle mark arrangement according to the first embodiment.

Referring to FIG. 4A, five kinds of reticle marks M1 to M5 are arranged in the kerf region RF. These reticle marks M1 to M5 correspond to the misalignment measurement marks that are not compared with each other at measurement of misalignment of the upper and lower layers in the semiconductor wafer. In addition, the five kinds of reticle marks M1 to M5 are provided on different reticles. In this case, as a constrain condition for arrangement, the reticle marks M1 to M5 can be arranged as close as possible to the four corners of the reticles such that they do not overlap one another between the reticles. In addition, the reticle marks M1 to M5 can be arranged such that there is no clearance between the reticle marks M1 to M5 on a plane formed by overlapping the reticles on which the reticle marks M1 to M5 are arranged. At that time, weights W1 to W5 can be assigned to the reticle marks M1 to M5 according to importance at measurement of misalignment. In addition, as illustrated in FIG. 4B, the reticle marks M1 to M5 can be arranged closer to the four corners of the reticles in descending order of the weights W1 to W5.

Then, as illustrated in FIGS. 4C and 4D, when the reticle marks M1 to M5 are arranged in the kerf region RF, a sum QS of areas Q1 to Q5 of five polygons with apexes at the arrangement positions of the reticle marks M1 to M5 is calculated. The arrangement positions of the reticle marks M1 to M5 can be decided such that the sum QS of the areas Q1 to Q5 of the five polygons becomes the largest.

At that time, the numbers of the reticle marks M1 and M3 to be arranged are each set to 8, and the numbers of the reticle marks M2, M4, and M5 to be arranged are each set to 4. In this case, as illustrated in FIG. 3A, the number of patterns of arrangement of the reticle marks M1 and M3 is one. In addition, as illustrated in FIG. 3B, the number of patterns of arrangement of the reticle marks M2, M4, and M5 is four. Accordingly, the sums QS of the areas Q1 to Q5 of the polygons are calculated in the $4^3$ patterns, and the arrangement positions of the reticle marks M1 to M5 can be selected from one of the foregoing patterns in which the sum QS of the areas Q1 to Q5 of the polygons becomes the largest.

FIGS. 5A and 5B are diagrams illustrating a comparative example of an area of reticle mark arrangement positions with a plurality of patterns of reticle mark arrangement according to the first embodiment.

When the reticle marks M1 to M5 are arranged as illustrated in FIG. 5A, the areas of polygons with apexes at the arrangement positions of the reticle marks M1 to M5 are designated as Q1A to Q5A. In addition, when the reticle marks M1 to M5 are arranged as illustrated in FIG. 5B, the areas of polygons with apexes at the arrangement positions of the reticle marks M1 to M5 are designated as Q1B to Q5B. If the sum of the areas Q1B to Q5B of the polygons is larger than the sum of the areas Q1A to Q5A of the polygons, the arrangement positions of the reticle marks M1 to M5 illustrated in FIG. 5B can be selected.

In addition, alignment marks A1 for use in reticle alignment can be arranged inside the reticle marks M1 to M5 in the kerf region RF. In addition, TEGs (Test Element Groupe) can also be arranged inside the reticle marks M1 to M5.

Figure 6:
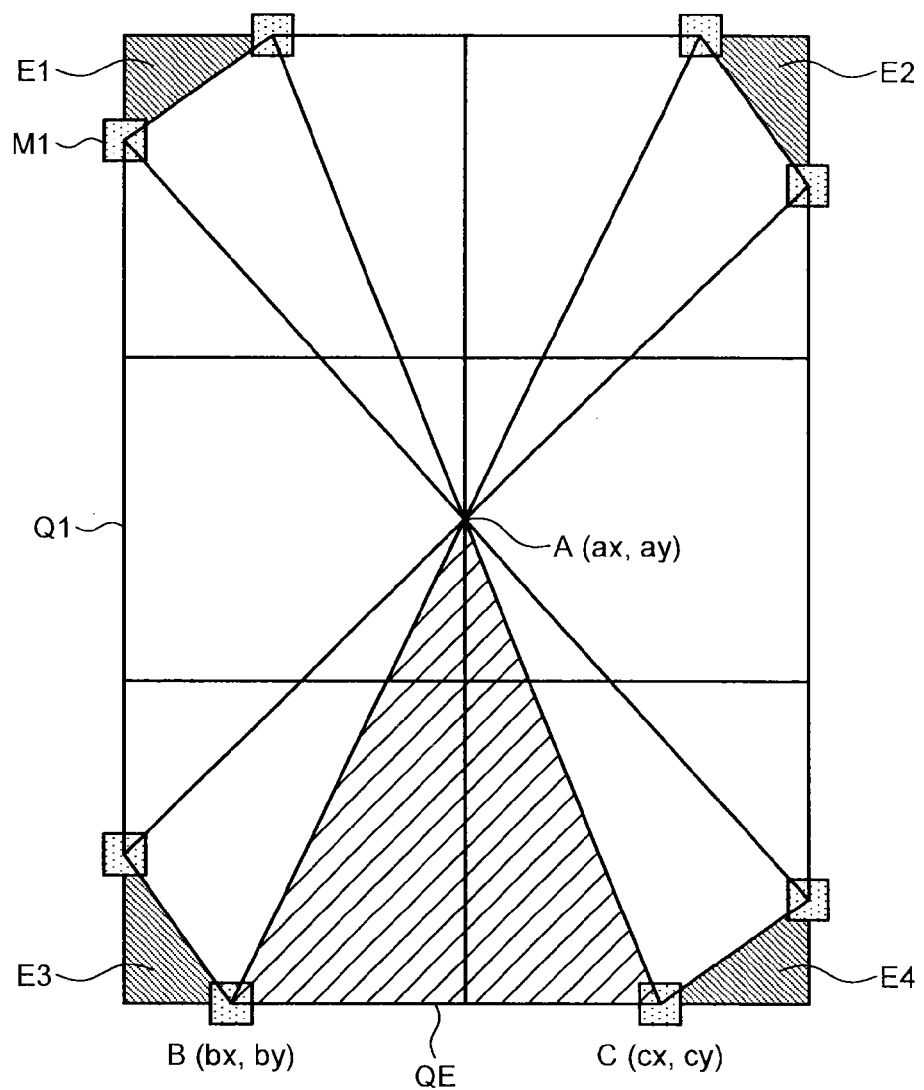
FIG. 6 is a diagram illustrating one example of a method for calculating the area of reticle mark arrangement positions according to the first embodiment.

FIG. 6 is a diagram illustrating one example of a method for calculating the area of reticle mark arrangement positions according to the first embodiment.

Referring to FIG. 6, if the area Q1 of the polygon with apexes at the arrangement positions of the reticle marks M1 is to be calculated, for example, lines are drawn from shot center A (ax, ay) in the polygon with apexes at the arrangement positions of the reticle marks M1, thereby to divide the polygon into triangles. Then, Heron's formula can be used to determine the areas of the triangles. For example, an area QE of a triangle formed by the shot center A (ax, ay) and apexes B (bx, by) and C (cx, cy) can be given by the equation $QE=(s(s-AB)(s-BC)(s-CA))^{1/2}$, where $AB=((ax-bx)^2+(ay-by)^2)^{1/2}$, $BC=((bx-cx)^2+(by-cy)^2)^{1/2}$, $CA=((cx-ax)^2+(cy-ay)^2)^{1/2}$, $s=(AB+BC+CA)/2$.

Alternatively, the area Q1 of the polygon with apexes at the arrangement positions of the reticle marks M1 may be calculated by subtracting areas E1 to E4 of triangles at the four corners of the kerf region RF from the area of the rectangle surrounded by the kerf region RF.

Figure 7:
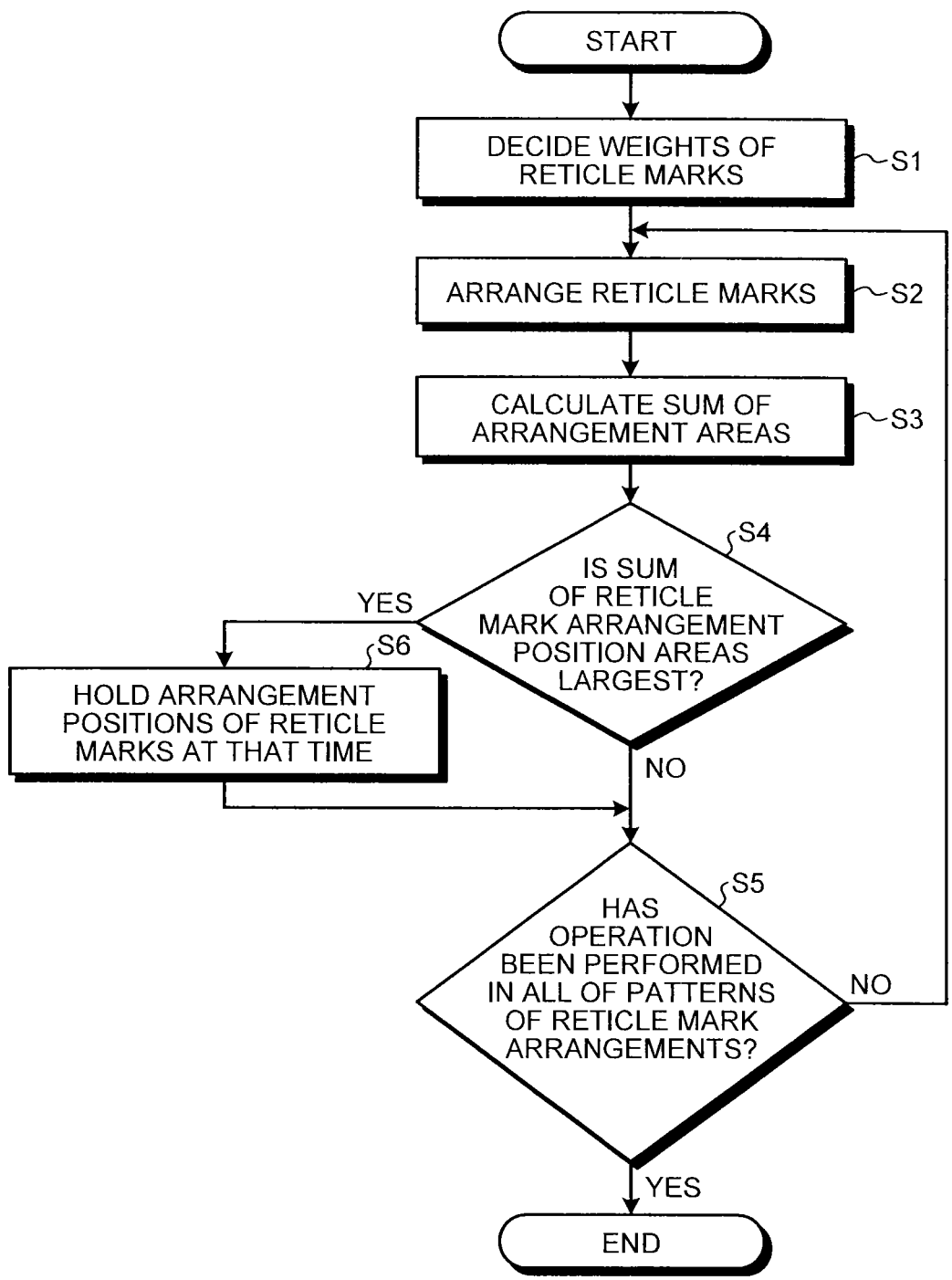
FIG. 7 is a flowchart of a method for reticle mark arrangement with a plurality patterns of reticle mark arrangement according to the first embodiment.

FIG. 7 is a flowchart of a method for reticle mark arrangement with a plurality of patterns of reticle mark arrangement according to the first embodiment.

Referring to FIG. 7, weights of reticle marks are decided according to importance of the reticle marks (S1). The importance of the reticle marks can be decided according to the specifications required for alignment of the upper and lower layers or depending on the presence or absence of use of past-generation reticle marks. Next, the reticle marks are arranged in the kerf regions of the reticles under certain constrain conditions (S2). The constrain conditions include a constraint to processing of upper and lower layers, a constraint to processing of a single layer, and distances from the arrangement positions to the outermost side of the shot.

Under the constraint to processing of the upper and lower layers, in the case where the reticle marks are arranged on the retiles corresponding to the upper and lower layers, if metal pieces are embedded in the retiles near the misalignment measurement mark corresponding to the reticle marks, for example, the reticle marks are separated and arranged from the reticle pattern for embedding of the metal pieces so as not to exert any influence on the shape of the misalignment measurement marks.

Next, the sum of areas of polygons with apexes at the arrangement positions of the retile marks (S3), and it is determined whether the sum of the areas of the polygons is the largest at that time (S4). Then, if the sum of the areas of the polygons is the largest at that time, the arrangement positions of the reticle marks at that time are held (S6). Meanwhile, if the sum of the areas of the polygons is not the largest at that time, it is determined whether the foregoing process is performed in all of the patterns of reticle mark arrangement (S5). If the foregoing process is not performed in all of the patterns of reticle mark arrangement, the steps S2 to S6 are repeated until the foregoing process is performed in all of the patterns of reticle mark arrangement.

(Second Embodiment)

Figure 8:
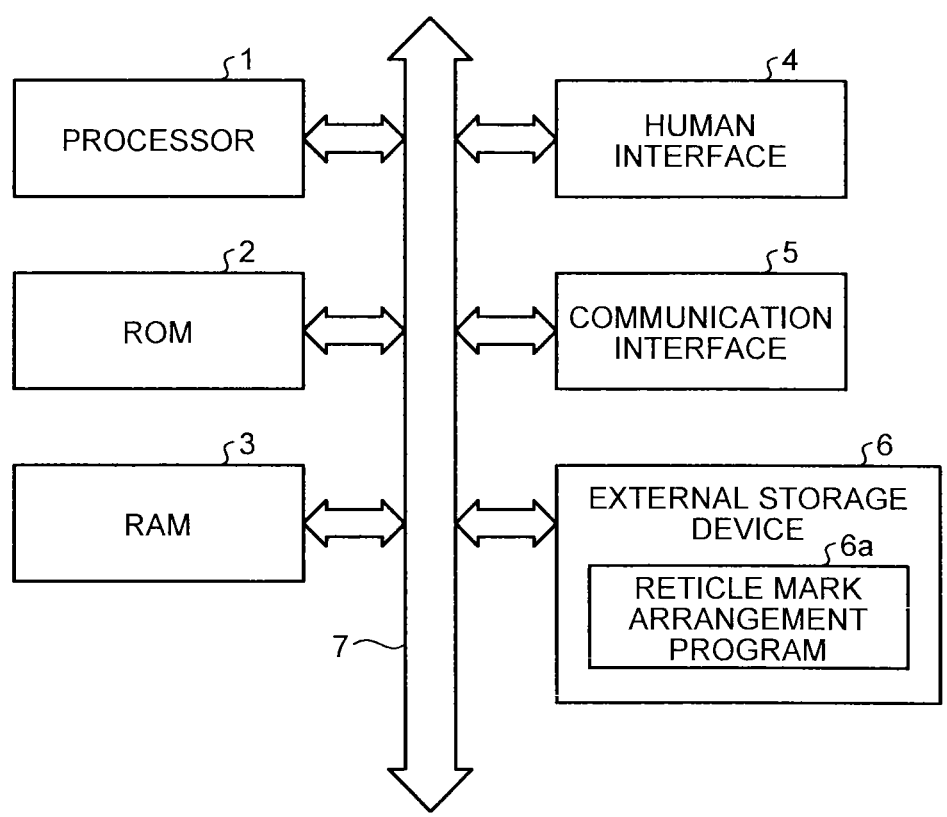
FIG. 8 is a block diagram of a hardware configuration of a CAD system according to a second embodiment.

FIG. 8 is a block diagram of a hardware configuration of a CAD system according to a second embodiment.

Referring to FIG. 8, a CAD system 12 can be provided with a processor 1 including a CPU and the like, a ROM 2 that stores fixed data, a RAM 3 that provides a work area and the like to the processor 1, a human interface 4 that intermediates between a human and a computer, a communication interface 5 that provides a means of external communication, and an external storage device 6 that stores programs for operating the processor 1 and various kinds of data. The processor 1, the ROM 2, the RAM 3, the human interface 4, the communication interface 5, and the external storage device 6 are connected together via a bus 7.

The external storage device 6 may be, for example, a magnetic disc such as a hard disc, an optical disc such as a DVD, a portable semiconductor storage device such as a USB memory or a memory card, or the like. The human interface 4 may be, for example, a keyboard, a mouse, or a touch panel as an input interface and a display or a printer as an output interface, or the like. The communication interface 5 may be, for example, an LAN card, a modem, or a router for connection with the Internet or an LAN, or the like. The external storage device 6 has a reticle mark arrangement program 6a installed therein for arrangement of reticle marks.

When the reticle mark arrangement program 6a is executed at the processor 1, the mark data N2 in which the reticle marks HM are arranged at a plurality of places in the kerf region of the reticle M, is calculated and sent to the mask data generation unit 13.

The reticle mark arrangement program 6a to be executed at the processor 1 may be stored in the external storage device 6 and then read to the RAM 3 at execution of the program, or may be stored in advance in the ROM 2, or may be acquired via the communication interface 5. In addition, the reticle mark arrangement program 6a may be executed at a stand-alone computer or a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reticle mark arrangement method, comprising:
arranging reticle marks at a plurality of places in a kerf region of a reticle;
calculating an area of a polygon with apexes at arrangement positions of the reticle marks in the kerf region of the reticle;
changing the arrangement positions of the reticle marks in the kerf region of the reticle based on a calculation result of the area of the polygon;
bringing the reticle marks into correspondence with misalignment measurement marks for measuring a misalignment of upper and lower layers; and
arranging the reticle marks corresponding to the misalignment measurement marks that are not compared with each other at measurement of a misalignment, as close as possible to four corners of the reticle so as not to overlap each other between reticles.

2. The reticle mark arrangement method according to claim 1, wherein
the reticle marks include N (N is an integer of 2 or more) kinds of reticle marks; and
the method further comprises:
calculating a sum of areas of N polygons with apexes at arrangement positions of the N kinds of reticle marks; and
changing the arrangement positions of the N kinds of reticle marks in the kerf region of the reticle based on calculation results of the sum of the areas of the polygons.

3. The reticle mark arrangement method according to claim 2, further comprising changing the arrangement positions of the N kinds of reticle marks such that the sum of the areas of the N polygons becomes the largest in a plurality of candidates of the arrangement positions.

4. The reticle mark arrangement method according to claim 2, further comprising:
assigning weights to the reticle marks according to importance at measurement of misalignment; and
arranging the reticle marks closer to the four corners of the reticle in descending order of the weights.

5. The reticle mark arrangement method according to claim 1, comprising arranging a plurality of reticle marks such that there is no clearance between the plurality of reticle marks on a plane formed by overlapping reticles on which the plurality of reticle marks are arranged.

6. The reticle mark arrangement method according to claim 1, comprising deciding numbers of reticle marks to be arranged on each reticle according to specifications required for alignment.

7. The reticle mark arrangement method according to claim 6, comprising setting the number of the reticle marks to be arranged on each reticle to four or eight according to the specifications required for alignment.

8. The reticle mark arrangement method according to claim 1, further comprising:
arranging a plurality of reticle marks at first arrangement positions in the kerf region of the reticle;
calculating an area of a polygon with apexes at the first arrangement positions of the plurality of reticle marks;
arranging the plurality of reticle marks at second arrangement positions in the kerf region of the reticle;
calculating an area of a polygon with apexes at the second arrangement positions of the plurality of reticle marks; and
selecting the first arrangement positions or the second arrangement positions based on calculation results of the areas of the polygons.

9. The reticle mark arrangement method according to claim 1, comprising arranging an alignment mark inside the arrangement positions of the reticle marks.

10. A nontransitory computer readable medium storing a reticle mark arrangement program for causing a computer to execute:
arranging reticle marks at a plurality of places in a kerf region of a reticle;
calculating an area of a polygon with apexes at arrangement positions of the reticle marks in the kerf region of the article;
changing the arrangement positions of the reticle marks in the kerf region of the reticle based on a calculation result of the area of the polygon;
bringing the reticle marks into correspondence with misalignment measurement marks for measuring a misalignment of upper and lower lavers; and
arranging the reticle marks corresponding to the misalignment measurement marks that are not compared with each other at measurement of a misalignment, as close as possible to four corners of the reticle so as not to overlap each other between reticles.

11. The nontransitory computer readable medium according to claim 10, wherein
the reticle marks include N (N is an integer of 2 or more) kinds of reticle marks; and
the program further causing the computer to execute:
calculating a sum of areas of N polygons with apexes at arrangement positions of the N kinds of reticle marks; and
changing the arrangement positions of the N kinds of reticle marks in the kerf region of the reticle based on calculation results of the sum of the areas of the polygons.

12. The nontransitory computer readable medium according to claim 11, the program further causing the computer to execute changing the arrangement positions of the N kinds of reticle marks such that the sum of the areas of the N polygons becomes the largest in a plurality of candidates of the arrangement positions.

13. The nontransitory computer readable medium according to claim 11, the program further causing the computer to execute:
assigning weights to the reticle marks according to importance at measurement of misalignment; and
arranging the reticle marks closer to the four corners of the reticle in descending order of the weights.

14. The nontransitory computer readable medium according to claim 10, the program further causing the computer to execute arranging a plurality of reticle marks such that there is no clearance between the plurality of reticle marks on a plane formed by overlapping reticles on which the plurality of reticle marks are arranged.

15. The nontransitory computer readable medium according to claim 10, the program further causing the computer to execute deciding numbers of reticle marks to be arranged on each reticle according to specifications required for alignment.

16. The nontransitory computer readable medium according to claim 15, the program further causing the computer to execute setting the number of the reticle marks to be arranged on each reticle to four or eight according to the specifications required for alignment.

17. The nontransitory computer readable medium according to claim 10, the program further causing the computer to execute:
- arranging a plurality of reticle marks at first arrangement positions in the kerf region of the reticle;
- calculating an area of a polygon with apexes at the first arrangement positions of the plurality of reticle marks;
- arranging the plurality of reticle marks at second arrangement positions in the kerf region of the reticle;
- calculating an area of a polygon with apexes at the second arrangement positions of the plurality of reticle marks; and
- selecting the first arrangement positions or the second arrangement positions based on calculation results of the areas of the polygons.

18. The nontransitory computer readable medium according to claim 10, the program further causing the computer to execute arranging an alignment mark inside the arrangement positions of the reticle marks.

* * * * *